UNIPOLAR TO BIPOLAR PULSE CONVERTER

Filed March 9, 1962

INVENTOR
N. E. LENTZ
BY Leonard M. Arnold
ATTORNEY

United States Patent Office 3,172,952
Patented Mar. 9, 1965

3,172,952

UNIPOLAR TO BIPOLAR PULSE CONVERTER

Norman E. Lentz, Haverhill, Mass., assignor to Bell Telephone Laboratories, Incorporated, New York, N.Y., a corporation of New York Filed Mar. 9, 1962, Ser. No. 178,781
2 Claims. (Cl. 178—70)

This invention relates to pulse generators and more particularly to pulse generators for alternately generating pulses of opposite polarity in response to input pulses of the same polarity.

In pulse code transmission systems employing so-called bipolar pulse transmission, which is discussed in United States Patent 2,996,578, issued to F. T. Andrews, Jr., on August 15, 1961, each pulse is transmitted as a pulse whose polarity is opposite that of an immediately preceding pulse and each space is transmitted as a space. In order to convert the unipolar pulse train output of the encoders, wherein each pulse is of the same polarity, into a bipolar pulse train suitable for transmission, the unipolar pulse train is applied, in the system disclosed in the above-mentioned patent, to a binary counter with the output of the counter differentiated to yield a bipolar pulse train. Such an arrangement, however, does not provide a high power output level to the transmission medium and it is desirable to accomplish this conversion with the resulting power output at a much higher level. One of the techniques which might be employed to accomplish the unipolar to bipolar conversion would be the use of a pair of blocking oscillators arranged to generate pulses of opposite polarity. The unipolar pulses would be applied to a binary counter or flip-flop circuit whose output signals would be applied to the blocking oscillators so that a first transition of the flip-flop circuit in response to a first unipolar pulse input signal would cause a first of the blocking oscillators to generate an output pulse of a first polarity, and a second transition of the flip-flop circuit in response to a second unipolar input pulse would cause the second blocking oscillator to generate an output pulse of a polarity opposite that of the first polarity. This technique, while providing a higher power output level than the simple binary counter-differentiator arrangement, has several disadvantages. First of all, it effectively doubles the number of active elements required by such a converter as compared with the binary counter-differentiator arrangement of the above-mentioned patent, and this, of course, reduces circuit reliability and increases the power consumed. In addition, it increases the cost of the conversion apparatus.

A principal object of this invention is to increase the power output of unipolar to bipolar pulse conversion apparatus without significantly increasing its cost or complexity.

A related object of this invention is to eliminate the need for a flip-flop circuit or other active steering circuitry in relatively high power unipolar to bipolar pulse conversion apparatus.

A further object of this invention is to increase the reliability of relatively high power unipolar to bipolar conversion apparatus through the elimination of half the number of active elements previously required.

Still another object of this invention is to reduce the powering requirements of relatively high power unipolar to bipolar conversion apparatus.

In accordance with this invention a pair of blocking oscillators each of which generates output pulses which are opposite in polarity with respect to one another are connected to a source of unipolar input pulses by means of capacitors. The capacitors function as memory elements so that input pulses are steered to alternate blocking oscillators in succession with the result that the combined output of the blocking oscillators represents the unipolar pulse input signal in bipolar pulse form. The blocking oscillators generate the bipolar pulse signal at a much higher power output level than that achieved by the binary counter-differentiator arrangement employed by the above-mentioned patent, but require the use of no additional active elements. Thus the cost and complexity of a high power converter embodying this invention is comparable to that of the relatively low power converter previously employed, and its circuit reliability is comparable to that of the low power converter.

This invention will be more fully comprehended from the following detailed description taken in conjunction with the drawing in which.

Figure 1:
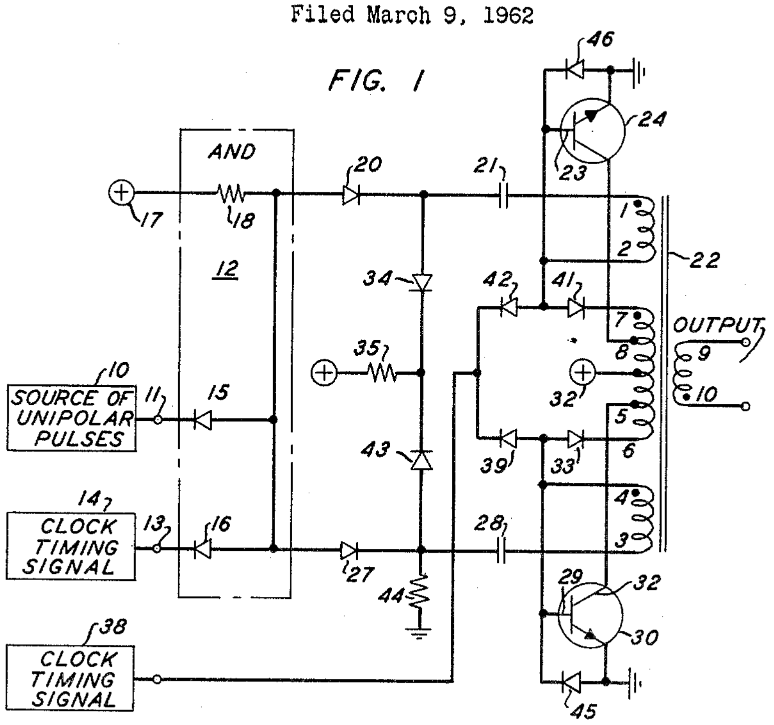
FIG. 1 is a drawing of a unipolar to bipolar pulse converter embodying the invention.
Figure 2:
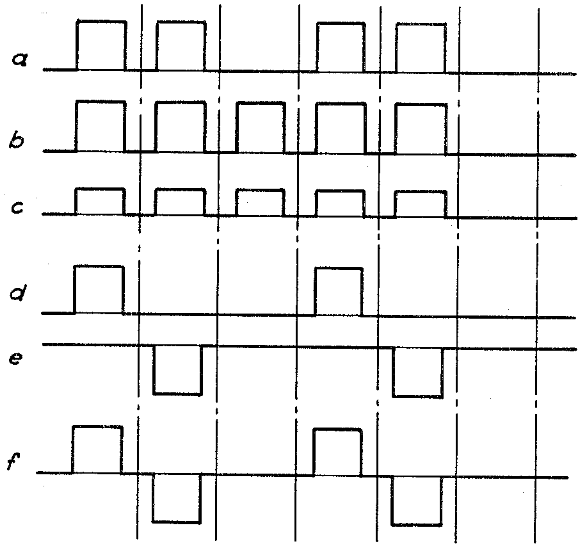
FIG. 2 is a series of waveforms showing the unipolar pulse input signal, the timing signals, and the bipolar pulse output signal.

A converter embodying the invention is shown in FIG. 1 and utilizes a pair of blocking oscillators arranged in push-pull configuration to accomplish the unipolar to bipolar pulse conversion. In coming unipolar pulse signals, shown in line *a* of FIG. 2, from a source 10 are applied to one input 11 of a two input AND gate 12. The second input terminal 13 of the AND gate 12 is connected to a source 14 of timing signals, shown in line *b* of FIG. 2, which generates a control signal at the beginning of each interval of time occupied by a pulse or a space emanating from source 10. The AND gate 12 itself may comprise the simple combination of two passive diodes 15 and 16. In the case, for example, where the incoming unipolar signals from source 10 comprise positive going pulses and the source of clock timing pulses 14 produces clock timing pulses which are positive going at the beginning of each pulse interval, each diode 15 and 16 has its cathode connected to its source 10, 14, respectively, and the anodes of both diodes are connected to voltage source 17 by means of resistor 18. Upon the occurrence of a unipolar pulse from source 10 and a clock timing pulse from source 14 the AND gate 12 produces an output current. This current may follow either of two paths. The first path comprises diode 20, capacitor 21, winding 1–2 of transformer 22 and terminates at the base electrode 23 of transistor 24. The second path which is identical to the first path comprises diode 27, capacitor 28, winding 3–4 of transformer 22, and terminates at the base electrode 29 of transistor 30.

The particular path which the current flowing from the AND gate 12 takes depends upon whether a pulse has previously been generated by the converter or whether any circuit unbalance exists. When a previous pulse or circuit unbalance has produced a positive charge on the diode 20 side of capacitor 21 and a zero charge on the diode 27 side of capacitor 28 the current from source 17 flowing through resistor 18 is blocked by the positive charge on capacitor 21 but flows through diode 27, capacitor 28, winding 3–4 of transformer 22 to the base electrode 29 of transistor 30. The current applied to the base electrode 29 of transistor 30 causes transistor 30 to conduct, causing a negative voltage to appear at terminal 5 of transformer winding 5–6, which winding is connected to the collector electrode 32 of transistor 30.

The transformer 22 has three main windings, winding 1–2, winding 3–4 and a center tap winding 6–7 whose center tap is connected to a source 32 of positive voltage. The polarities of these three windings and the single output winding 9–10 are marked by dots in accordance with the usual convention to indicate that the dotted side of a transformer winding has the same polarity as the dotted side of every other transformer winding, and thus the negative going voltage which appears at terminal 5 of transformer winding 5–6 appears with positive polarity on the side of each transformer winding marked by a dot on the drawing.

The transistor 30, winding 5–6 and winding 3–4 comprise a blocking oscillator. The negative pulse at terminal 3 of winding 3–4 steers the current flowing from source 17 through resistor 18 maintaining the transistor 30 in a conductive condition and charges capacitor 28 positive during the on period. When transistor 30 is conducting the negative pulse at the collector electrode 32 causes diode 33 to conduct so that excess current from source 17 flowing through resistor 18, which would normally be applied to the base electrode 29 of transistor 30 to cause saturation, is shunted to the collector electrode 32 through diode 33 to prevent saturation of the transistor and increase turn-off speed. While transistor 30 is conducting, a positive pulse appears on winding 1–2 of transformer 22 resulting in a positive voltage appearing on the transformer side of capacitor 21. This positive voltage plus the original charge on capacitor 21 causes diode 34 to conduct which allows the charge on capacitor 21 to leak off through resistor 35, transformer winding 1–2 and diode 46 until the net charge on capacitor 21 is approximately zero. The period during which the blocking oscillator generates an output pulse is terminated by the occurence, at the end of each pulse interval, of the negative going pulse shown in line *c* of FIG. 2, which is generated by source 38. The negative going pulse from source 38 causes diode 39 to conduct diverting feedback current from the base electrode 29 of transistor 30 thus rendering the transistor non-conducting. The output pulse generated by the blocking oscillator, shown in line *d* of FIG. 2, appears on output winding 9–10 as a pulse of a first polarity.

In accordance with the invention the original positive charge on capacitor 21 was dissipated and the zero charge on capacitor 28 was replaced by a positive charge during the conduction period of transistor 30. As a result, the next positive pulse from AND gate 12 flows through diode 20 but is blocked at diode 27 by the positive voltage on capacitor 28. Transistor 24 is now turned on causing a negative voltage pulse, shown in line *e* of FIG. 2, to appear at the dotted side of each transformer winding and the resulting cycle of operation again reverses the charges on capacitor 21 and capacitor 28 so that each successive input pulse is steered to the opposite side of the dual blocking oscillator from the immediately preceeding input pulse to produce pulses of alternate polarity, shown in line *f* of FIG. 2, at the output. The operation of the circuit when transistor 24 is conducting is the same as that when transistor 30 is conducting and the following components, diode 41, diode 42, diode 43 and diode 46 have the same function with respect to the conduction of transistor 24 as diode 33, diode 39, diode 34 and diode 45, respectively, had with respect to the conduction of transistor 30.

To avoid the possibility of having the same charge on capacitors 21 and 28, which would block both sides of the push-pull blocking oscillator from oscillation, resistor 44 is provided to supply a leakage path to discharge capacitor 28 sufficiently to trigger transistor 30 on, thus assuring a start to the above-described operation.

Thus in accordance with the above invention a pair of blocking oscillators are used to convert the unipolar pulse input signals into bipolar output signals. Only two active elements, namely, transistors 24 and 30, are required and there is no necessity for employing a multivibrator or pulse steering circuit in order to alternately activate the blocking oscillators. Thus a relatively high power output is available from the blocking oscillators without the necessity for complicated steering circuitry and this, of course, reduces the cost of the apparatus and its powering requirements and increases its reliability.

It is to be understood that the above-described arrangements are illustrative of the application and the principles of the invention. Numerous other arrangements may be devised by those skilled in the art without departing from the spirit and scope of the invention.

What is claimed is:

1. In combination, a source of a train of unipolar pulses, a pair of blocking oscillators, a load circuit connected to said oscillators to receive pulses of one polarity from one oscillator and pulses of the opposite polarity from the other said oscillator, a pair of diode switches having their inputs connected in parallel to said source and their outputs connected to respective ones of said pair of blocking oscillators to cause the operation of each oscillator when the respective diode switch is closed, and a storage capacitor connected between each oscillator and its associated diode switch for controlling the respective switch in response to the previous condition of the respective oscillator whereby the respective oscillators are rendered operative in response to alternate pulses from said pulse train.

2. A unipolar to bipolar pulse converter comprising, in combination, a source of unipolar pulse input signals which generates unipolar pulses and spaces each of which occupies a predetermined time interval, a first source of pulse timing signals which generates first timing signals one of which occurs at the beginning of each pulse time interval, a second source of pulse timing signals which generates second timing signals one of which occurs at the end of each pulse time interval, and AND gate to which said source of unipolar pulse input signals and said first source of timing signals are connected to generate at an output terminal an output current upon the occurrence at the same instant of time of a unipolar input pulse and a first timing pulse, a pair of blocking oscillators each of which generates pulses which are opposite in polarity, a first unilateral current conductive element and a first capacitor serially connected between said output terminal of said AND gate and the feedback path of a first of said blocking oscillators, a second unilateral current conductive element and a second capacitor serially connected between said output terminal of said AND gate and the feedback path of a second of said blocking oscillators, means to charge said first capacitor and discharge said second capacitor when said first blocking oscillator is generating an output pulse in response to a first output current generated by said AND gate, means to charge said second capacitor and discharge said first capacitor when said second blocking oscillator is generating an output pulse in response to a second output current generated by said AND gate, means connected to said second source of pulse timing signals to terminate the generation of an output pulse by said blocking oscillators at the end of a pulse time interval, whereby said blocking oscillators alternate in generating output pulses in response to input pulses from said source of unipolar input pulses.

References Cited in the file of this patent

UNITED STATES PATENTS 3,071,733 Holzer et al. ------------ Jan. 1, 1963